(12) United States Patent
Maruhashi et al.

(10) Patent No.: US 6,903,700 B2
(45) Date of Patent: Jun. 7, 2005

(54) HIGH FREQUENCY CIRCUIT SUBSTRATE AND METHOD FOR FORMING THE SAME

(75) Inventors: Kenichi Maruhashi, Tokyo (JP); Masaharu Ito, Tokyo (JP); Keiichi Ohata, Tokyo (JP); Kazuhiro Ikuina, Tokyo (JP); Takeya Hashiguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/133,326

(22) Filed: Apr. 29, 2002

(65) Prior Publication Data

US 2002/0158722 A1 Oct. 31, 2002

(30) Foreign Application Priority Data

Apr. 27, 2001 (JP) .......................... 2001-131654

(51) Int. Cl.⁷ ................................. H01P 3/08
(52) U.S. Cl. .................. 343/770; 333/246; 333/125
(58) Field of Search ................. 343/770, 700 MS, 343/905, 906, 846, 850, 767, 772, 774, 853, 848; 333/246, 125

(56) References Cited

U.S. PATENT DOCUMENTS

| | | |
|---|---|---|
| 6,356,245 B2 * | 3/2002 | Metzen et al. ............... 343/905 |
| 6,492,949 B1 * | 12/2002 | Breglia et al. ....... 343/700 MS |
| 6,535,090 B1 * | 3/2003 | Matsuzuka et al. .......... 333/246 |

FOREIGN PATENT DOCUMENTS

| | | |
|---|---|---|
| JP | A 4-352503 | 12/1992 |
| JP | A 6-291536 | 10/1994 |
| JP | A 9-237867 | 9/1997 |
| JP | A 11-40702 | 2/1999 |
| JP | A 11-261309 | 9/1999 |
| JP | A 11-307685 | 11/1999 |
| JP | A 2000-196314 | 7/2000 |
| JP | A 2000-269708 | 9/2000 |
| JP | A 2001-292008 | 10/2001 |

OTHER PUBLICATIONS

Y. Amano et al., "Multi–Layered Substrates for Wireless Communication Modules at 60GHz," 29th European Microwave Conference, Munich 1999, pp. 301–304.

(Continued)

*Primary Examiner*—James Vannucci
(74) *Attorney, Agent, or Firm*—Young & Thompson

(57) ABSTRACT

A high frequency circuit substrate comprises a first high frequency circuit substrate including at least a first dielectric material layer, a first conductor layer, a second dielectric material layer and a second conductor layer, which are laminated in the named order, the first conductor layer having a first slot formed therein, and the second conductor layer forming a transmission line, the first dielectric material layer having a first opening exposing the first slot at its bottom. The high frequency circuit substrate also comprises a second high frequency circuit substrate including at least a third dielectric material layer, a third conductor layer, a fourth dielectric material layer and a fourth conductor layer, which are laminated in the named order, the third conductor layer having a second slot formed therein, and the fourth conductor layer forming a transmission line, the third dielectric material layer having a second opening exposing the second slot at its bottom. The first high frequency circuit substrate and the first high frequency circuit substrate are bonded to each other in such a manner that the first dielectric material layer and the third dielectric material layer are faced to each other and the first slot and the second slot are electromagnetically coupled, by inserting one side and the other side of a conductor plate having a through hole into the first opening and the second opening, respectively.

51 Claims, 10 Drawing Sheets

OTHER PUBLICATIONS

Yasutake Hirachi et al., "A Cost–Effective RF–Module with Built–in Patch Antenna for Millimeter–Wave Wireless Systems, "29th European Microwave Conference, Munich, 1999, pp. 347–350.

Yasutake Hirachi et al., "A Cost–Effective RF–Module with Built–in Patch Antenna for Millimeter–Wave Wireless Systems, "29th European Microwave Conference, Munich, 1999, pp. 347–350.

* cited by examiner

HIGH FREQUENCY CIRCUIT SUBSTRATE AND METHOD FOR FORMING THE SAME

BACKGROUND OF THE INVENTION

The present invention relates to a high frequency technology applicable to a microwave and a millimeter wave, and more specifically to a high frequency circuit substrate capable of relaxing a positional precision when circuit substrates are electromagnetically coupled, or of easily ensuring a required positional precision while elevating a close contact between electromagnetic coupling parts, and a connecting method therefor.

In the prior art high frequency circuit, when a millimeter "multi-chip module" (abbreviated "MCM") and an antenna are connected, a coaxial cable or a waveguide (in narrow meaning) is used in many cases. In a relatively large scaled module, similar means is used for interconnecting a high frequency circuit substrate to another high frequency circuit substrate. Therefore, the high frequency circuit substrate and the antenna are required to have a waveguide conversion structure or a coaxial connector.

In the prior art, on the other hand, various methods which uses neither the coaxial cable nor the waveguide, have been proposed to realize a microminiaturization and a low cost. For example, there has been proposed a prior connecting technology for interconnecting between a microstrip line on the high frequency circuit substrate and a microstrip line of a planner antenna by a wiring bonding (See Y. Hirachi et al, "A Cost-Effective RF-Module with Built-in Patch Antenna for Millimeter-Wireless Systems", 29th European Microwave Conference, Digest, Vol. 3, pp.347–350, 1999). Alternatively, there has been proposed another prior connecting technology of mounting an integrated circuit on a rear surface of an antenna board in a flip chip manner, and connecting the integrated circuit to the antenna by means of a via hole or by action of an electromagnetic coupling (See G. Baumann et al, "51 GHz Frontend with Flip Chip and Wire Bond Interconnections from GaAs MMICs to a Planar Patch Antenna", 1995 IEEE MTT-S International Microwave Symposium, Digest, pp.1639–1642, or Y. Amano et al, "Multi-Layered Substrates for Wireless Communication Modules at 60 GHz", 29th European Microwave Conference, Digest, Vol. 2, pp.301–304, 1999).

However, in the prior technology using the wire bonding, particularly when an array antenna of a high gain is connected, another problem is encountered in that a feeder line loss becomes large. On the other hand, a prior technology for mounting an integrated circuit on a relatively large board such as an antenna board is difficult to ensure a planar pattern precision or planarity, and therefore, can be applied to a highly precise mounting technology such as a flip chip method and a BGA (Ball Grid Array) method.

In order to overcome the above mentioned problems, for example, Japanese Patent Application Pre-examination Publication No. JP-A-09-237867 proposes a small-sized high frequency package structure which can be manufactured in a mass production and which can reduce the loss attributable to a connection between an antenna circuit substrate and a high frequency device circuit substrate.

Referring to FIG. 14, there is shown a diagrammatic sectional view of a main part of a prior art high frequency circuit substrate. A first high frequency circuit substrate 1 includes a first dielectric material layer 3, a first conductor layer 41 having a slot 4 formed therein, a second dielectric material layer 5 and a second conductor layer 24 so that a high frequency transmission line 6 is formed of the second conductor layer 24. A second high frequency circuit substrate 2, which has an antenna (not shown), is layered over the first high frequency circuit substrate 1 to be connected to the first high frequency circuit substrate 1. This second high frequency circuit substrate 2 includes a third dielectric material layer 9 similar to the first dielectric material layer 3, a third conductor layer 51 having a slot 10 formed therein, a fourth dielectric material layer 11 and a fourth conductor layer 52. A high frequency transmission line 12 is formed on a surface of the second high frequency circuit substrate 2 facing the first high frequency circuit substrate 1. On the opposite surface of the second high frequency circuit substrate 2, an element 34 of the antenna is formed of a conductor pattern.

With this construction, a radio signal received by the antenna element 34 is guided by an electromagnetic coupling through the slot 10 formed in the second high frequency circuit substrate 2, to the high frequency transmission line 12, and further, by an electromagnetic coupling through the slot 4 formed in the first high frequency circuit substrate 1, to the high frequency transmission line 6.

However, an actual problem is a precision in lamination of the first high frequency circuit substrate. In this connection, a prior packaging technology having this construction and constituted by use of lamination, is proposed by, for example, Kooriyama et al, in Technical Bulletin ED-99-214/MW99-146, pp35–42, Society of Electronics, Information and Communication Engineers (of Japan). However, this prior art involves a severe problem in which a high precision is required in positioning or alignment between the slot 4 and the high frequency transmission line 12 formed on the second high frequency circuit substrate 2 shown in FIG. 14.

For example, assuming that an operating frequency is 60 GHz, a dielectric constant of the dielectric material is 10, and the transmission line is a microstrip line, FIG. 13 shows an increment of connection loss caused by a positional deviation (in a signal direction) between the slit and the microstrip line. Referring to FIG. 13, if the increment of connection loss is defined as 0.5 dB, an allowable positional deviation becomes ±0.15 mm.

As a technology which can meet with this precision and which is suitable to mass production, there is a method of forming the first and second high frequency circuit substrates together by using a ceramic material. In this method, there is a restrictive condition that the same quality of material must be used for the first high frequency circuit substrate 1 and the second high frequency circuit substrate 2. In addition, when substrates having different dielectric constants are used, when an inner layer part is included, when a cavity structure is involved, or when the substrate is relatively large, it becomes difficult to obtain a device size and a device constant as designed, by use of sintering, with the result that the yield of production lowers.

In order to overcome the above mentioned problem, JP-A-09-237867 proposes a method for bonding independently formed high frequency circuit substrates by use of an alloy such as AuSn, soldering or an epoxy resin. However, in this prior art for bonding the independently formed high frequency circuit substrates, it is required to maintain the circuit substrates in a close contact condition so that no electromagnetic leakage occurs. However, when a conventional ceramic formation technology is used, a bowing occurs on the order of 0.03 mm to 0.06 mm per 1 cm square. Therefore, in a large substrate area such as in a large scaled multi-chip module, it is difficult to bring the connecting parts in close contact with each other so that the respective grounds of the substrates cannot be effectively connected to each other.

Furthermore, this prior art includes another problem in which it is difficult to meet with the requirement of the positional precision. For example, when the positional precision of ±0.15 mm is required, a mounter having a high degree of positioning precision is required. In order to obtain the high degree of positioning precision, it may be considered to utilize a BGA mounting technology using a self-alignment process. When the bowing of the substrate is large, it is difficult to apply this technology.

BRIEF SUMMARY OF THE INVENTION

Accordingly, it is an object of the present invention to provide a high frequency circuit substrate and a connecting method therefor, which have overcome the above mentioned problems of the prior art.

Another object of the present invention is to provide a high frequency circuit substrate capable of relaxing a positional precision required when circuit substrates are electromagnetically coupled, or of easily ensuring a required positional precision while elevating a close contact between electromagnetic coupling parts, and a connecting method therefor.

The above and other objects of the present invention are achieved in accordance with the present invention by a high frequency circuit substrate comprising:

a first high frequency circuit substrate including at least a first dielectric material layer, a first conductor layer, a second dielectric material layer and a second conductor layer, which are laminated in the named order, the first conductor layer having a first slot formed therein, and the second conductor layer forming a feeder line; and a second high frequency circuit substrate including at least a third dielectric material layer, a third conductor layer, a fourth dielectric material layer and a fourth conductor layer, which are laminated in the named order, the third conductor layer having a second slot formed therein, and the fourth conductor layer forming a transmission line, the first high frequency circuit substrate and the first high frequency circuit substrate being stacked to each other in such a manner that the first dielectric material layer and the third dielectric material layer are faced to each other and the first slot and the second slot are electromagnetically coupled.

Preferably, the first slot and the second slot are positioned to face to each other.

In one embodiment of the high frequency circuit substrate, the first high frequency circuit substrate has a first ground conductor plane formed on an surface of the first dielectric material layer opposite to the first conductor layer, the first ground conductor having an opening at a position corresponding to the first slot, and the second high frequency circuit substrate has a second ground conductor plane formed on an surface of the third dielectric material layer opposite to the third conductor layer, the second ground conductor having an opening at a position corresponding to the second slot. The first high frequency circuit substrate and the first high frequency circuit substrate are stacked in such a manner that the first ground conductor plane is in contact with the second ground conductor plane.

In this embodiment, preferably, the first ground conductor plane is electrically connected to the first conductor layer through via holes, and the second ground conductor plane is electrically connected to the third conductor layer through via holes.

In another embodiment of the high frequency circuit substrate, the first high frequency circuit substrate includes the first dielectric material layer, the first conductor layer, the second dielectric material layer, the second conductor layer, a fifth dielectric material layer and a ground conductor layer, which are laminated in the named order. The first conductor layer has the first slot formed therein, and the second conductor layer has a third slot formed therein and constitutes the transmission line. The first slot and the third slot are positioned to be electromagnetically coupled, and the first high frequency circuit substrate and the first high frequency circuit substrate are stacked to each other in such a manner that the first slot, the third slot and the second slot are electromagnetically coupled.

In still another embodiment of the high frequency circuit substrate, the first high frequency circuit substrate includes the first dielectric material layer, the first conductor layer, the second dielectric material layer, the second conductor layer, a fifth dielectric material layer and a fifth conductor layer, which are laminated in the named order. A waveguiding structure is formed of the second conductor layer, the fifth conductor layer and a group of via holes interconnecting between the second conductor layer and the fifth conductor layer. The first conductor layer has the first slot formed therein, and the second conductor layer has a third slot formed therein. The first slot and the third slot are positioned to be electromagnetically coupled, and the first high frequency circuit substrate and the first high frequency circuit substrate are stacked to each other in such a manner that the first slot, the third slot and the second slot are electromagnetically coupled.

In these embodiments, the first slot and the third slot are positioned to face to each other, and the first slot and the second slot are positioned to face to each other.

In the above mentioned embodiments, preferably, at least one of the first dielectric material layer and the third dielectric material layer has a recess formed therein. More preferably, each of the first dielectric material layer and the third dielectric material layer has a recess formed therein having a bottom exposing the slot of an underlying conductor layer. In addition, a conductor plate having a through hole is located in the respective recesses of the first dielectric material layer and the third dielectric material layer.

In a specific embodiment of the high frequency circuit substrate, the through hole having at least two different opening sizes coupled by a stepped portion. Preferably, a dielectric material plate is inserted on the stepped portion of the through hole. In any case, the first high frequency circuit substrate and the first high frequency circuit substrate are electromagnetically coupled to each other through the through hole of the conductor plate One of the first high frequency circuit substrate and the first high frequency circuit substrate may include an antenna or a semiconductor device chip connected to the transmission line.

According to another aspect of the present invention, there is provided a method for fabricating a high frequency circuit substrate, comprising the steps of:

preparing a first high frequency circuit substrate including at least a first dielectric material layer, a first conductor layer, a second dielectric material layer and a second conductor layer, which are laminated in the named order, the first conductor layer having a first slot formed therein, and the second conductor layer forming a transmission line, the first dielectric material layer having a first opening exposing the first slot at its bottom;

preparing a second high frequency circuit substrate including at least a third dielectric material layer, a third conductor layer, a fourth dielectric material layer and a fourth conductor layer, which are laminated in the named order, the third conductor layer having a second slot formed therein, and the fourth conductor layer forming a transmission line, the third dielectric material layer having a second opening exposing the second slot at its bottom; and bonding the first high frequency circuit substrate and the first high frequency circuit substrate to each other in such a manner that the first dielectric material layer and the third dielectric material layer are faced to each other and the first slot and the second slot are electromagnetically coupled, by inserting one side and the other side of a conductor plate having a through hole, into the first opening and the second opening, respectively.

The above and other objects, features and advantages of the present invention will be apparent from the following description of preferred embodiments of the invention with reference to the accompanying drawings.

DETAILED DESCRIPTION OF THE INVENTION

First Embodiment

Now, a first embodiment of the high frequency circuit substrate in accordance with the present invention will be described with reference to the drawings.

Figure 1:
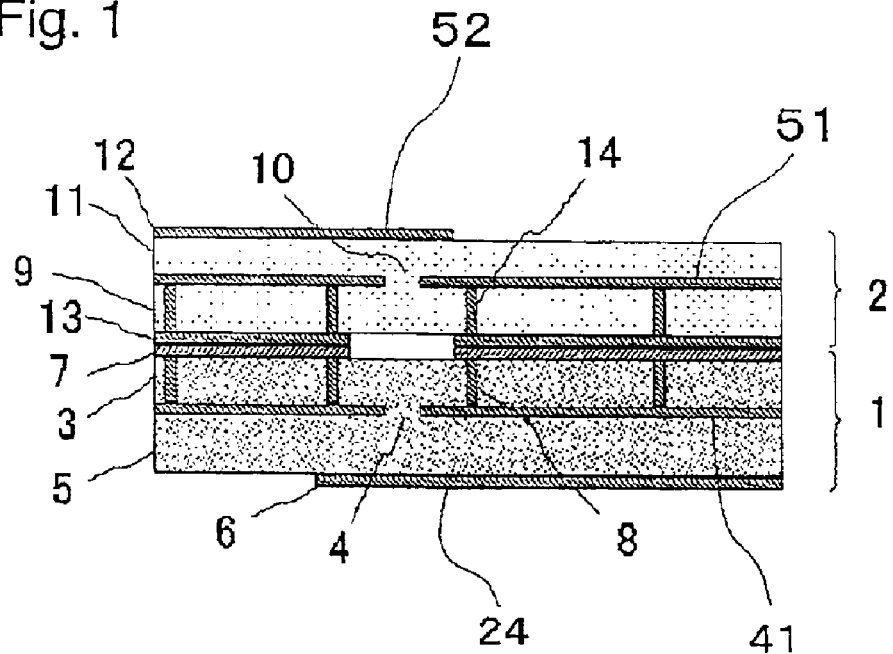
FIG. 1 is a diagrammatic sectional view of a main part of a first embodiment of the high frequency circuit substrate in accordance with the present invention.

Referring to FIG. 1, there is shown a diagrammatic sectional view of a main part of the first embodiment of the high frequency circuit substrate in accordance with the present invention.

As shown in FIG. 1, the first embodiment comprises a first high frequency circuit substrate 1, which includes a first dielectric material layer 3, a first conductor layer 41 having a slot 4 formed therein, a second dielectric material layer 5 and a second conductor layer 24 forming a high frequency transmission line 6 (feeder line), which are laminated in the named order.

Furthermore, a ground plane 7 having an opening is formed on an surface of the first dielectric material layer 3, and is connected to the first conductor layer 41 having the slot 4 through a via hole 8.

A second high frequency circuit substrate 2 includes a third dielectric material layer 9, a third conductor layer 51 having a slot 10 formed therein, a fourth dielectric material layer 11 and a fourth conductor layer 52 forming a high frequency transmission line 12, which are laminated in the named order.

Furthermore, a ground plane 13 having an opening is formed on an surface of the third dielectric material layer 9, and is connected to the third conductor layer 51 having the slot 10 through a via hole 14.

The first high frequency circuit substrate 1 and the second high frequency circuit substrate 2 are laminated in such a manner that the ground plane 7 having the opening and the ground plane 13 having the opening are faced to each other Now, the first high frequency circuit substrate 1 will be described in detail with references to FIGS. 2A and 2B, which are an upper plan view and a sectional view of the first high frequency circuit substrate 1 of the first embodiment shown in FIG. 1.

Figure 2A:
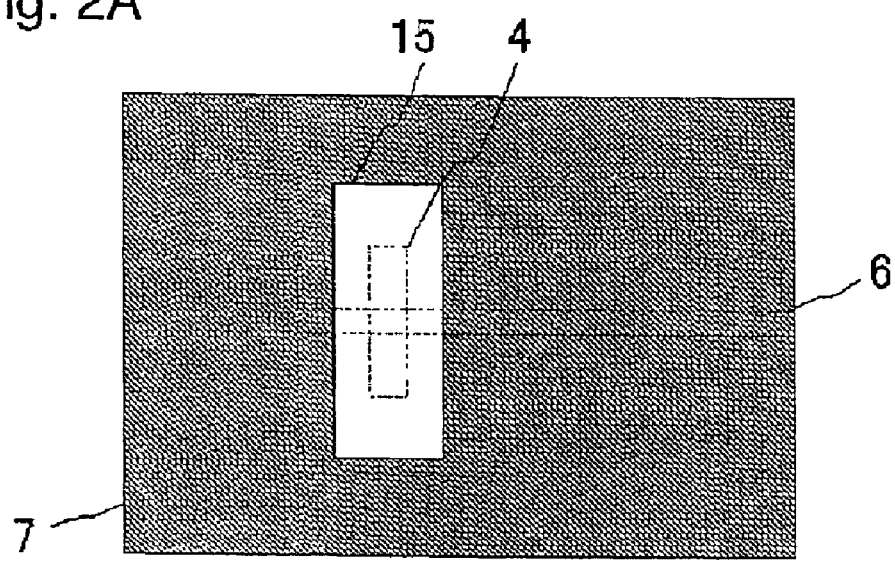
FIGS. 2A and 2B are an upper plan view and a sectional view of a first high frequency circuit substrate of the first embodiment shown in FIG. 1.
Figure 2B:
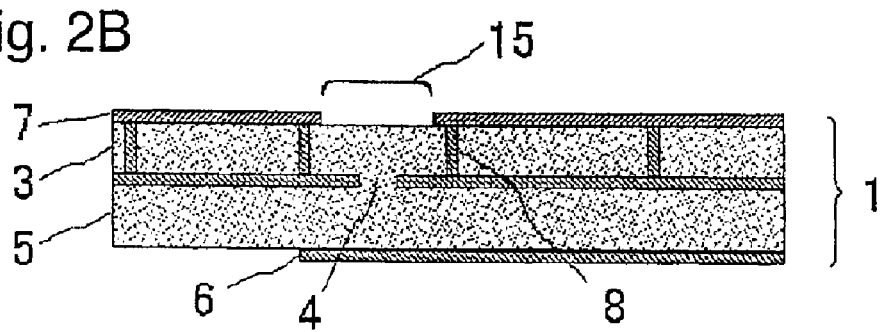

As seen from FIGS. 2A and 2B, the high frequency transmission line 6 is constituted of a microstrip line, and an incident signal to this transmission line is radiated through the slot 4 from the opening designated with Reference Number 15 in FIGS. 2A and 2B, formed in the ground plane 7. The second high frequency circuit substrate 2 laminated on the first high frequency circuit substrate 1 has a similar structure as shown in FIG. 1, so that the radiated signal reaches the high frequency transmission line 12 formed in the second high frequency circuit substrate 2 by traveling in the order opposite to that in the first high frequency circuit substrate 1.

With this arrangement in which the slot 4 is located to face to the slot 10, a good signal transmission is obtained.

Figure 13:
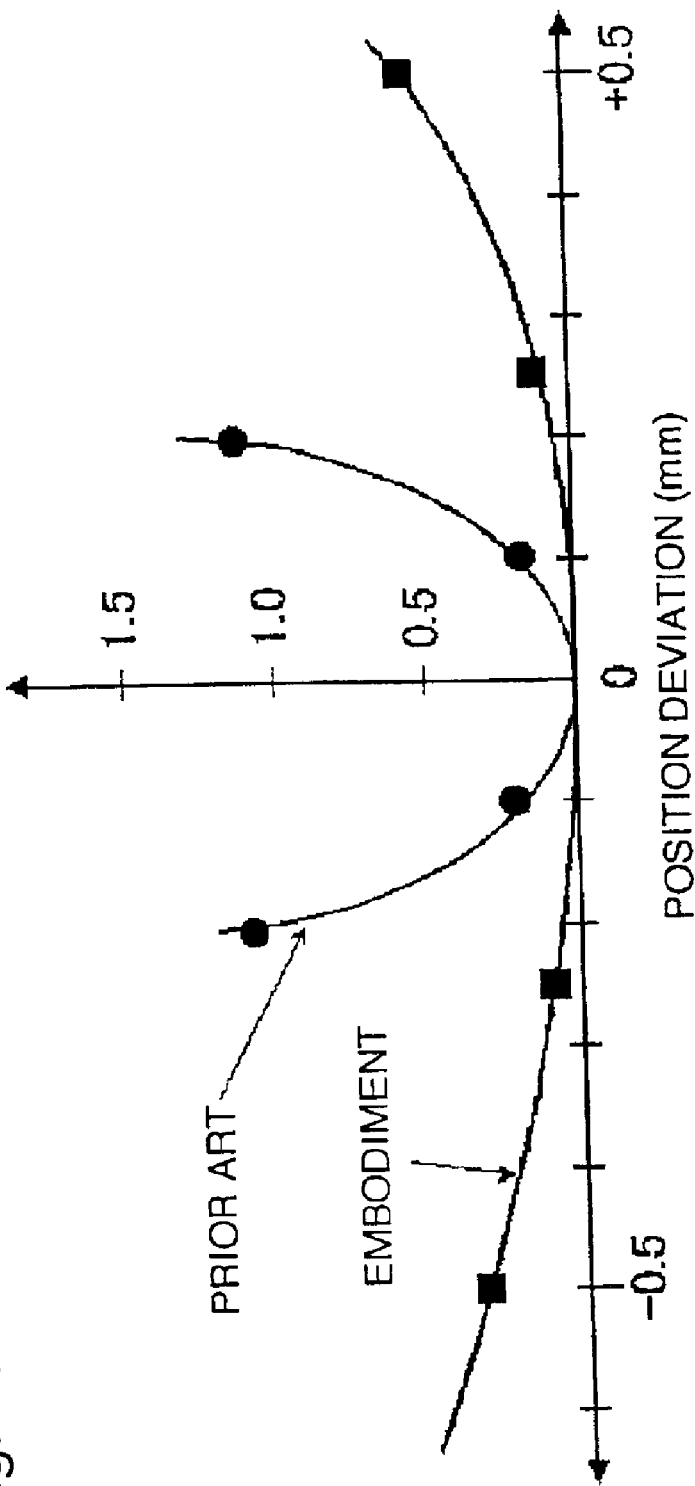
FIG. 13 is a graph showing an increment of connection loss caused by a positional deviation (in a signal direction) between the slit and the microstrip line.
Figure 14:
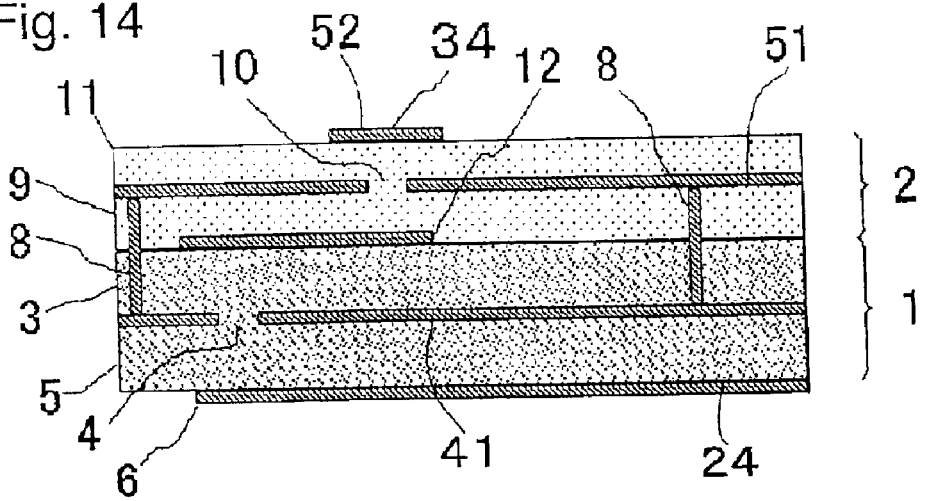
FIG. 14 is a diagrammatic sectional view of a main part of the high frequency circuit substrate in the prior art.

Referring to FIG. 13, there is shown an example of the relation between an increment of connection loss and a positional deviation (in a signal direction of the high frequency transmission line) between the first high frequency circuit substrate 1 and the second high frequency circuit substrate 2 under an operating frequency of 60 GHz. As seen from FIG. 13, if the increment of connection loss is defined as 0.5 dB, an allowable positional deviation becomes −0.6 mm to +0.5 mm, and therefore, is greatly relaxed in comparison with the prior art.

The bonding between the first high frequency circuit substrate 1 and the second high frequency circuit substrate 2 can be realized by using an alloy such as AuSn, soldering or an epoxy resin, but can be also simply realized by a screw if a precise boring is used.

Incidentally, if the position of the slots 4 and 10 are deviated, the connection loss becomes large. However, even in a conventional multilayer substrate forming process, since it is possible to maintain the positional deviation of the slot pattern in each of the circuit substrates 1 and 2 within the range of +0.1 mm, this positional deviation is negligible in comparison with the positional deviation between the first high frequency circuit substrate 1 and the second high frequency circuit substrate 2.

Second Embodiment

Figure 3:
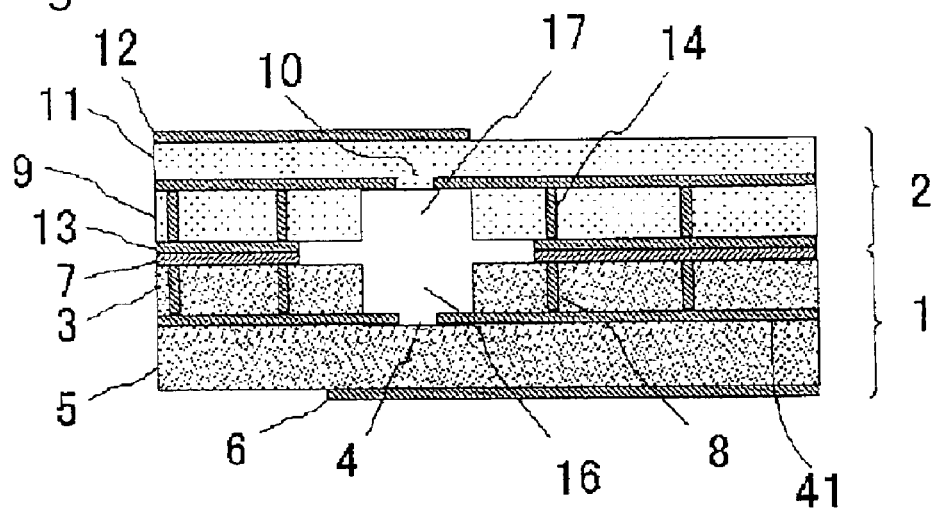
FIG. 3 is a diagrammatic sectional view of a main part of a second embodiment of the high frequency circuit substrate in accordance with the present invention.

Now, a second embodiment of the high frequency circuit substrate in accordance with the present invention will be described with reference to the drawings. FIG. 3 is a diagrammatic sectional view of a main part of the second embodiment of the high frequency circuit substrate in accordance with the present invention. In FIG. 3, elements similar to those shown in the preceding figures are given the same Reference Numbers, and explanation will be omitted for simplification of description.

As shown in FIG. 3, in this second embodiment, the first high frequency circuit substrate 1 has a recess 16 formed by partially removing in the first dielectric material layer 3, so that the slot 4 is exposed. For example, this recess 16 can be formed by laminating the first dielectric material layer 3 which was bored at a position corresponding to the recess 16, on the second dielectric material layer 5 having the conductor layer 41.

Similarly, the second high frequency circuit substrate 2 has a recess 16 formed by partially removing in the third dielectric material layer 9, so that the slot 10 is exposed.

Next, the first high frequency circuit substrate 1 will be described in detail with reference to FIGS. 4A and 4B, which are an upper plan view and a sectional view of the first high frequency circuit substrate 1 of the second embodiment shown in FIG. 3.

Figure 4A:
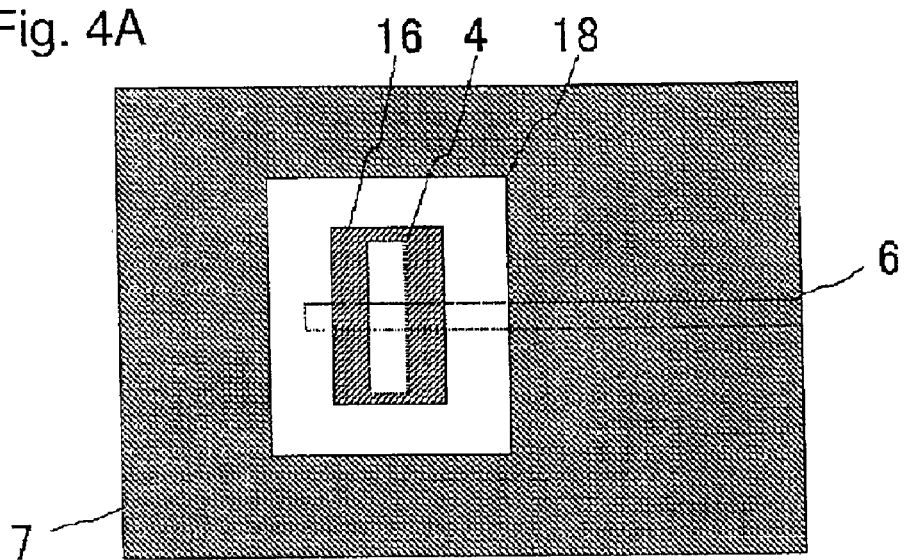
FIGS. 4A and 4B are an upper plan view and a sectional view of a first high frequency circuit substrate of the second embodiment shown in FIG. 3.
Figure 4B:
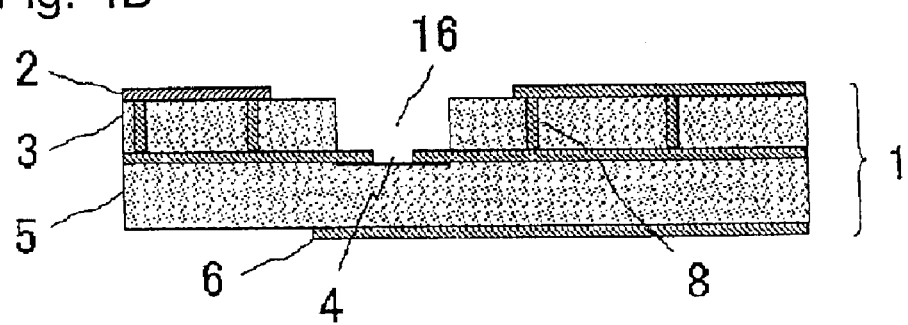

As seen from FIGS. 4A and 4B, the high frequency transmission line 6 is constituted of a microstrip line, and an incident signal to this transmission line 6 is radiated from the recess 16 through the slot 4 in the opening designated with Reference Number 18 in FIGS. 4A and 4B, formed in the ground plane 7. The second high frequency circuit substrate 2 laminated on the first high frequency circuit substrate 1 has a similar structure as shown in FIG. 3, so that the radiated signal reaches the high frequency transmission line 12 formed in the second high frequency circuit substrate 2 by traveling in the order opposite to that in the first high frequency circuit substrate 1. In this second embodiment, since no dielectric material exists in the recesses 16 and 17 in the connecting parts, attenuation attributable to a dielectric loss is advantageously smaller than that in the first embodiment In the second embodiments, the recesses 16 and 17 have a depth corresponding to the thickness of the dielectric layers 3 and 9 and a size capable of completely exposing the slots 4 and 10. However, even if the recesses 16 and 17 have a size of partially exposing the slots 4 and 10, it is possible to reduce the dielectric loss.

Third Embodiment

Figure 5:
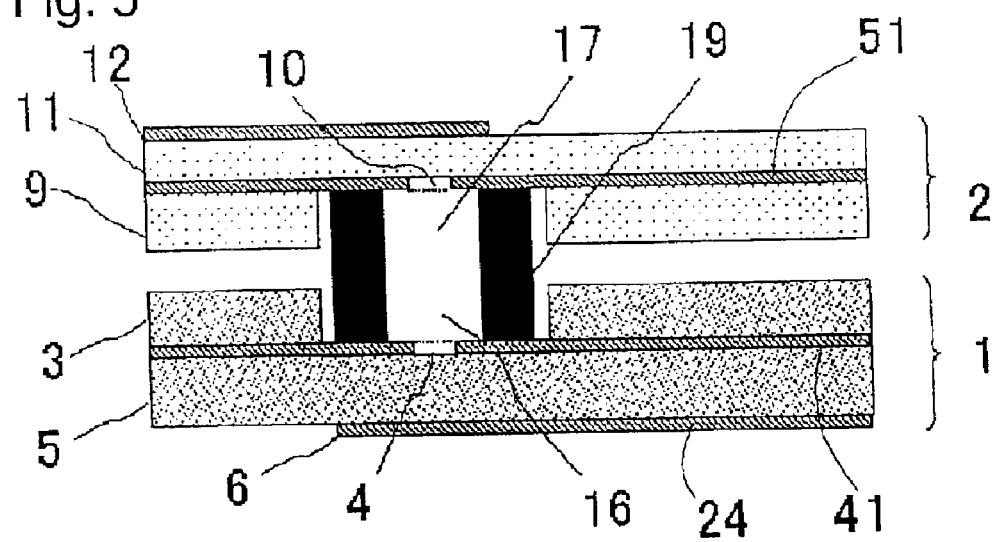
FIG. 5 is a diagrammatic sectional view of a main part of a third embodiment of the high frequency circuit substrate in accordance with the present invention.

Now, a third embodiment of the high frequency circuit substrate in accordance with the present invention will be described with reference to the drawings. FIG. 5 is a diagrammatic sectional view of a main part of the third embodiment of the high frequency circuit substrate in accordance with the present invention. In FIG. 5, elements similar to those shown in the preceding figures are given the same Reference Numbers, and explanation will be omitted for simplification of description.

As shown in FIG. 5, the third embodiment comprises a first high frequency circuit substrate 1, which includes a first dielectric material layer 3, a first conductor layer 41 having a slot 4 formed therein, a second dielectric material layer 5 and a second conductor layer 24 forming a high frequency transmission line 6 (feeder line), which are laminated in the named order.

In the first high frequency circuit substrate 1, a recess 16 is formed by partially removing in the first dielectric material layer 3, so that the slot 4 is exposed.

In this recess 16, a conductor plate 19 having a through hole formed therein is located, and is bonded to the first conductor layer 41 by for example soldering.

A second high frequency circuit substrate 2 includes a third dielectric material layer 9, a third conductor layer 51 having a slot 10 formed therein, a fourth dielectric material layer 11 and a fourth conductor layer 52 forming a high frequency transmission line 12, which are laminated in the named order.

Similarly, in the second high frequency circuit substrate 2, a recess 17 is formed by partially removing in the first dielectric material layer 3, so that the slot 4 is exposed.

The first high frequency circuit substrate 1 and the second high frequency circuit substrate 2 are laminated in such a manner that the ground formed of the first conductor layer 41 and the ground formed of the third conductor layer 51 are electrically connected to each other by means of the conductor plate 19 and the high frequency transmission line 6 and the high frequency transmission line 12 are connected by an electromagnetic coupling through the slot 4, the through hole of the conductor plate 19 and the slot 10.

Now, the first high frequency circuit substrate 1 will be described in detail with references to FIGS. 6A and 6B, which are an upper plan view and a sectional view of the first high frequency circuit substrate 1 of the third embodiment shown in FIG. 5.

Figure 6A:
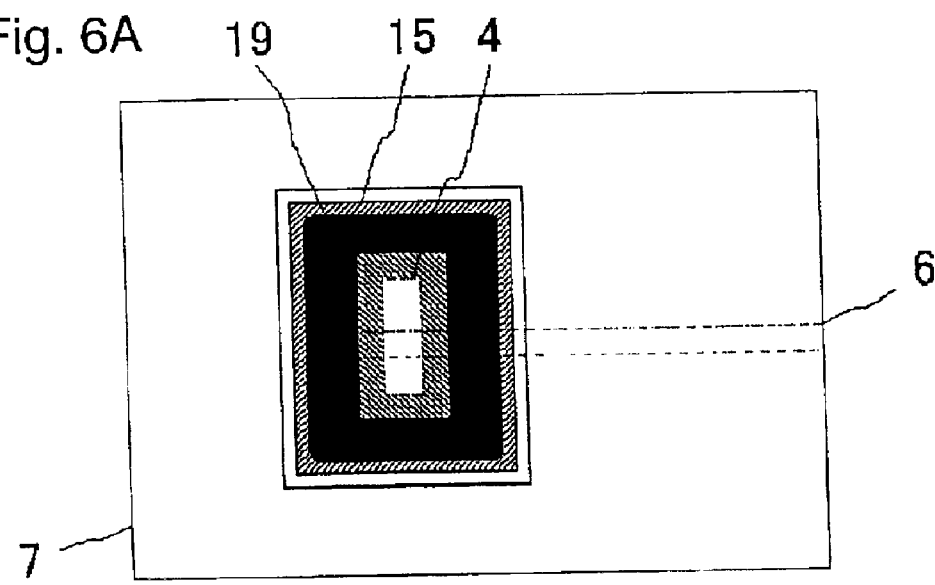
FIGS. 6A and 6B are an upper plan view and a sectional view of a first high frequency circuit substrate of the third embodiment shown in FIG. 5.
Figure 6B:
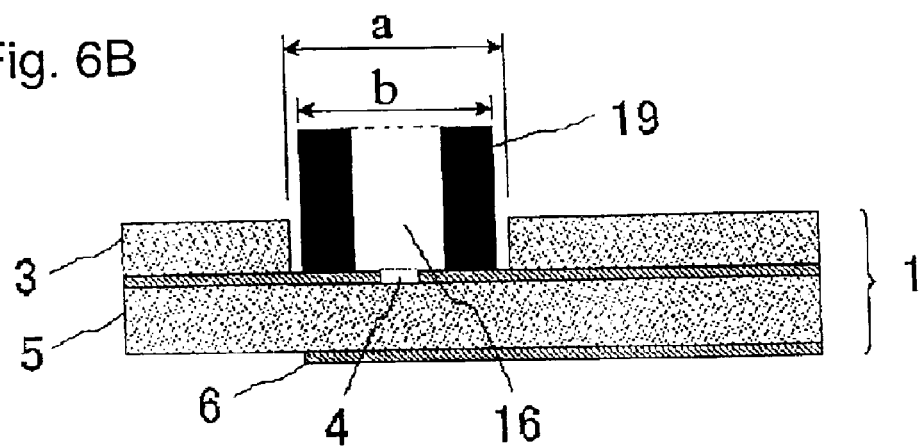

As seen from FIGS. 6A and 6B, in this embodiment, an internal size "a" of the recess 16 formed in the first high frequency circuit substrate 1 (and the recess 17 formed in the second high frequency circuit substrate 2) is larger than an external size "b" of the conductor plate 19 by a predetermined amount "X" (=a−b). In this case, the predetermined amount "X" is preferred to be a sum of a tolerance of the internal size "a" of the recess 16 worked and a tolerance of the external size "b" of the conductor plate 19 worked.

Figure 7:
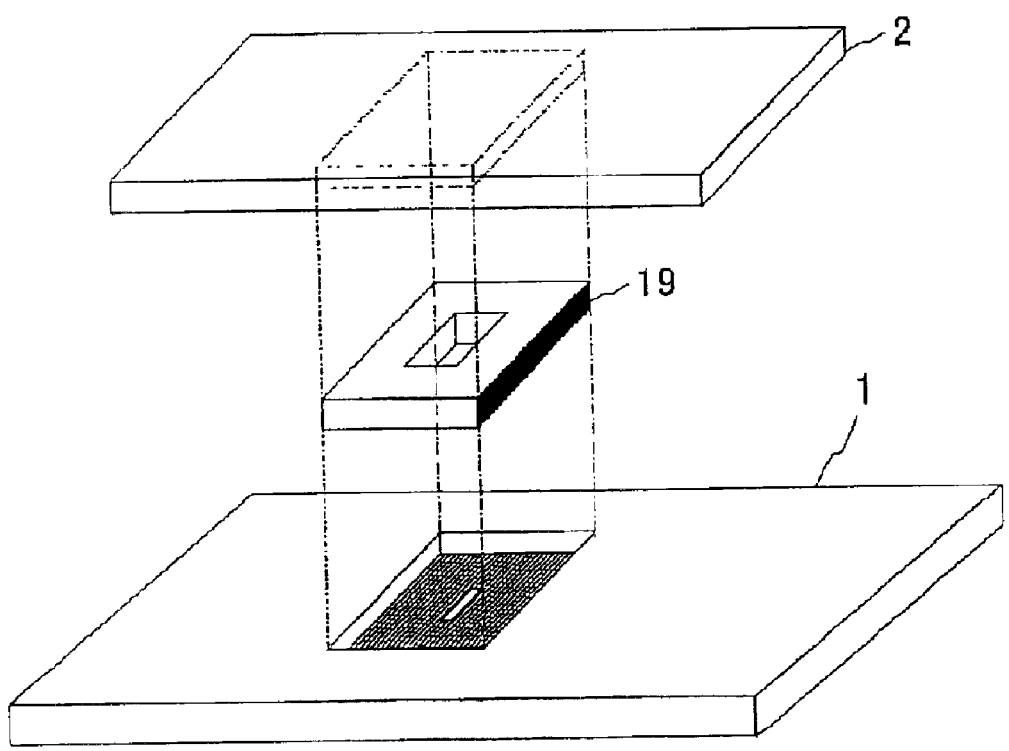
FIG. 7 is a conceptual view for illustrating a connection between a first high frequency circuit substrate and a second high frequency circuit substrate.

Referring to FIG. 7, there is shown a conceptual view for illustrating a connection between the first high frequency circuit substrate 1 and the second high frequency circuit substrate 2.

As seen from FIG. 7, respective connecting positions of the first high frequency circuit substrate 1 and the second high frequency circuit substrate 2 to each other is determined and limited by the conductor plate 19. The first high frequency circuit substrate 1 and the second high frequency circuit substrate 2 are held to each other by pushing the second high frequency circuit substrate 2 to the first high frequency circuit substrate 1. In this case, a holding and fixing means is not limited, but a screw or a soldering can be used.

An advantage of use of the conductor plate having the through hole is that the positioning is easy. Depending upon the material being used and the forming process being used, when each of first high frequency circuit substrate 1 and the second high frequency circuit substrate 2 uses a ceramic material as a dielectric material and when the conductor plate 19 is formed of Kovar (trademark), it is relatively easy to realize a size margin "X" of 0.1 mm to 0.5 mm. Therefore, if first high frequency circuit substrate 1 and the second high frequency circuit substrate 2 are laminated as shown in FIG. 7, a maximum deviation becomes ±X/2. It would be understood that the allowable range of positional deviation mentioned hereinbefore in the present invention can be relatively easily satisfied. In addition, a mounter having a high degree of positioning precision is no longer necessary.

In this embodiment, even if the first high frequency circuit substrate 1 and the second high frequency circuit substrate 2 are relatively large in size and therefore have a bowing, it is possible to surely realize the connection by action of the electromagnetic coupling. If the conductor plate 19 was not used, when a contacting surface of at least one of first high frequency circuit substrate 1 and the second high frequency circuit substrate 2 has a concave bowing, a gap occurs between the first high frequency circuit substrate 1 and the second high frequency circuit substrate 2, so that portions to be connected are never brought into a close contact over the whole of the contacting surface. If the contacting surface has a convex bowing, it is difficult to closely contact portions to be connected of the first high frequency circuit substrate 1 and the second high frequency circuit substrate 2.

In this embodiment, when the conductor plate 19 is used, it is sufficient at least if opposite contacting surfaces of the conductor plate 19 is in close contact with the first high frequency circuit substrate 1 and the second high frequency circuit substrate 2. Therefore, if the thickness of the conductor plate 19 is larger than a sum of an estimated amount of bowing, the depth of the recess 16 and the depth of the recess 17, it is possible to surely realize the connection by action of the electromagnetic coupling.

Incidentally, in this embodiment, as shown in FIG. 7, the conductor plate 19 in the form of a rectangular solid has a rectangular through hole. However, the through hole is in no way limited to the shown shape. In addition, the conductor plate 19 is sufficient if a surface is a conductor, and therefore, an internal body of the conductor plate 19 may be formed of an insulating material.

In this embodiment, furthermore, it was experimentally confirmed that the frequency characteristics of the connecting part can be changed by changing the size of the internal size of the conductor plate 19 (the size of the through hole). For example, when one side of the rectangular through hole in the conductor plate 19 was reduced by 25%, the frequency characteristics was shifted toward a high frequency side by 5%. This means that if some number of conductor plates 19 having different internal sizes are prepared, it is possible to adjust the frequency characteristics, or it is possible to comply with a plurality of frequency bands with adding no modification to the high frequency circuit substrate.

Similarly to the second embodiment, this third embodiment has an advantage that since no dielectric material exists in the recesses 16 and 17 in the connecting parts, attenuation attributable to a dielectric loss is smaller than that in the first embodiment.

Figure 15A:
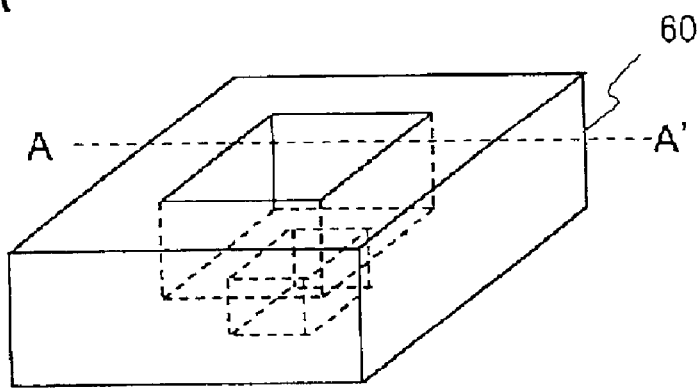
FIGS. 15A and 15B are a diagrammatic perspective view and a diagrammatic sectional view of a conductor plate in the third embodiment of the high frequency circuit substrate in accordance with the present invention.
Figure 15B:
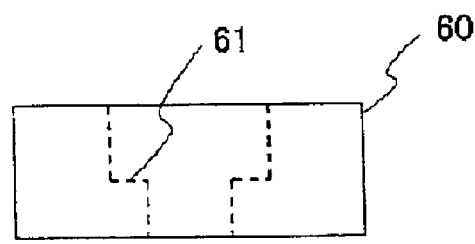

Referring to FIGS. 15A and 15B, there are shown a diagrammatic perspective view and a diagrammatic sectional view of another conductor plate which can be used in place of the conductor plate 19, in the third embodiment of the high frequency circuit substrate in accordance with the present invention.

The modified conductor plate designated with the Reference Number 60, has a through hole formed therein, which however has a step structure 61 in which two different internal opening sizes are coupled by a stepped portion. This conductor plate 60 increases the degree of freedom in designing the electromagnetic coupling structure, in comparison with the conductor plate 19, with the result that the thickness of the conductor plate can be made to a desired value.

Figure 16A:
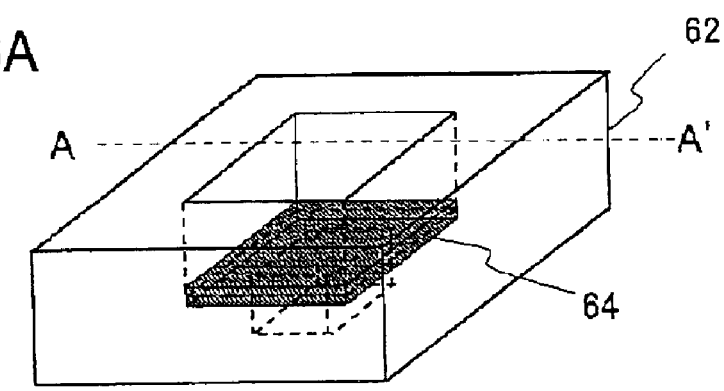
FIGS. 16A and 16B are a diagrammatic perspective view and a diagrammatic sectional view of another example of the conductor plate in the third embodiment of the high frequency circuit substrate in accordance with the present invention.
Figure 16B:
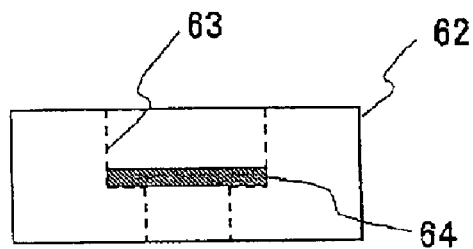

Referring to FIGS. 16A and 16B, there are shown a diagrammatic perspective view and a diagrammatic sectional view of still another example of the conductor plate which can be used in place of the conductor plate 19, in the third embodiment of the high frequency circuit substrate in accordance with the present invention.

This modified conductor plate designated with the Reference Number 62, has a through hole formed therein, which has a step structure 63 in which two different internal opening sizes are coupled by a stepped portion and in which a dielectric plate 64 is inserted on the stepped portion. In this case, the dielectric plate 64 is preferred to have a small dielectric loss, and is formed of for example a quartz plate or a ceramic plate.

Similarly to the conductor plate 60, the conductor plate 62 increases the degree of freedom in designing the electromagnetic coupling structure, in comparison with the conductor plate 19, with the result that the thickness of the conductor plate can be made to a desired value.

Figure 17A:
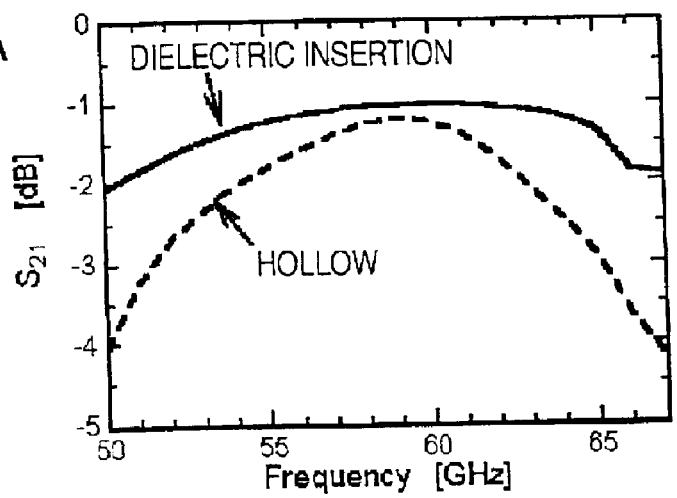
FIGS. 17A and 17B are graphs illustrating a transmission characteristics of the connection part in the third embodiment of the high frequency circuit substrate in accordance with the present invention.
Figure 17B:
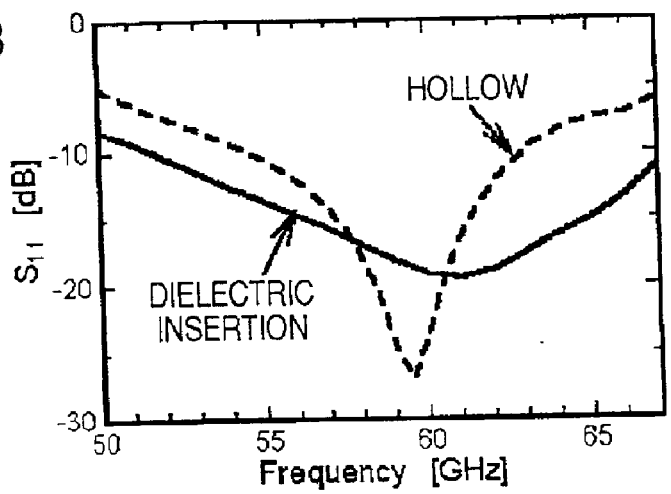

Referring to FIGS. 17A and 17B, there are shown graphs illustrating a transmission coefficient (S21) and a reflection coefficient (S11) of the connection part in the third embodiment in the case of using the conductor layer 19 and in the case of using the conductor plate 62.

It would be seen from FIGS. 17A and 17B that, the insertion of the dielectric plate (use of the conductor plate 62) can obtain a wide band of transmission characteristics (S21, S11) in comparison with the hollow case (use of the conductor plate 19). Incidentally, in the modifications shown in FIGS. 15A and 15B and FIGS. 16A and 16B, the through hole has the two different internal opening sizes coupled by one stepped portion, but can have three or more different internal opening sizes coupled by two or more stepped portions.

As mentioned above, by using the stepped structure in the through hole of the conductor plate and inserting the dielectric plate into the through hole, the frequency characteristics can be improved. In addition, since the number of the structure parameters (the size, the dielectric constant of the dielectric plate, etc.) in increased, the degree of freedom in design is increased. Moreover, if a plurality of conductor plates having different structures are prepared, it is possible to use a plurality of circuit substrates having different electromagnetic coupling structures as the second high frequency circuit substrate, while maintaining the first high frequency circuit substrate with no modification.

Fourth Embodiment

Figure 8:
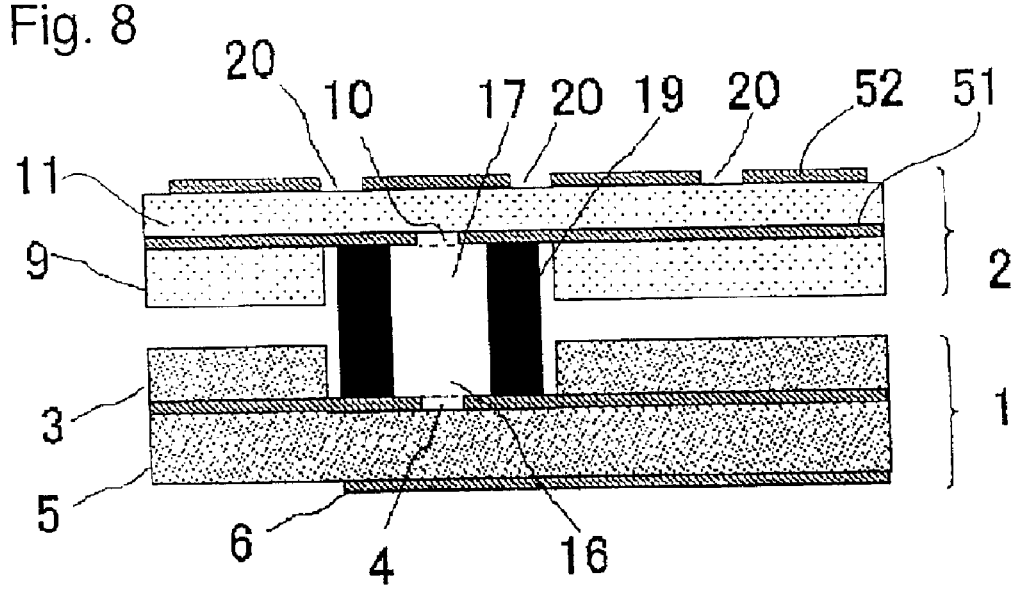
FIG. 8 is a diagrammatic sectional view of a main part of a fourth embodiment of the high frequency circuit substrate in accordance with the present invention.

Now, a fourth embodiment of the high frequency circuit substrate in accordance with the present invention will be described with reference to the drawings. FIG. 8 is a diagrammatic sectional view of a main part of the fourth embodiment of the high frequency circuit substrate in accordance with the present invention. In FIG. 8, elements similar to those shown in the preceding figures are given the same Reference Numbers, and explanation will be omitted for simplification of description.

As shown in FIG. 8, the fourth embodiment comprises a first high frequency circuit substrate 1 and a conductor plate 19, similar to the third embodiment, but a second high frequency circuit substrate 2 constitutes an antenna.

This antenna includes a third dielectric material layer 9, a third conductor layer 51 having a slot 10 formed therein, a fourth dielectric material layer 11 and a fourth conductor layer 52 having a plurality of slots 20 to form antenna elements, which are laminated in the named order.

A signal from the first high frequency circuit substrate 1 is transferred through the slot 4, the through hole of the conductor plate 19 and the slot 10 formed in the antenna 2, to a waveguiding structure formed in the fourth dielectric material layer 11. Although not shown, the waveguiding structure is formed of the third conductor layer 51, the fourth conductor layer 52 and a group of via holes interconnecting between the third conductor layer 51 and the fourth conductor layer 52.

In this embodiment, it is possible to supply a power to a central portion of an array antenna having a plurality of radiation elements, so that a loss in the power supplying can be reduced. In addition, similarly to the first to third embodiments, the required positioning precision can be relaxed, and the connection by the electromagnetic coupling can be surely obtained.

Fifth Embodiment

Figure 9A:
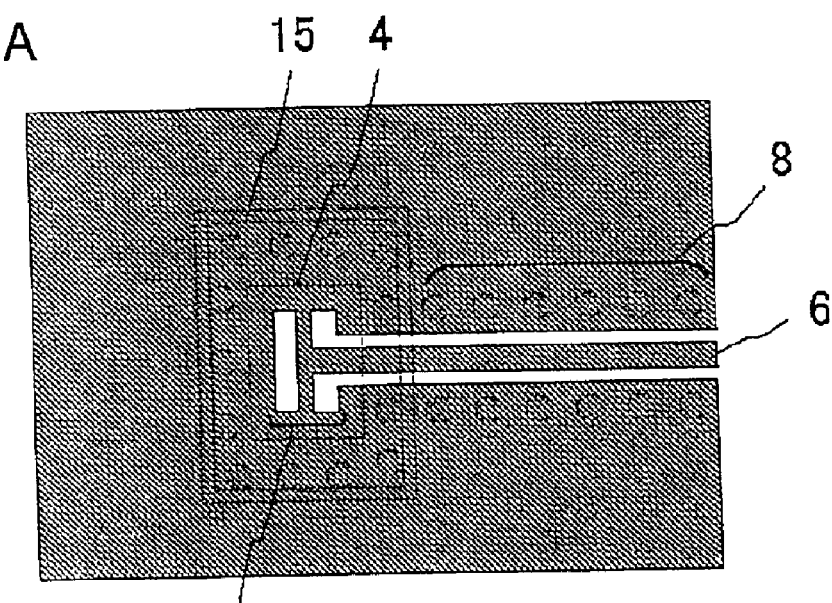
FIGS. 9A and 9B are a conductor pattern diagram and a sectional view of a first high frequency circuit substrate of a fifth embodiment of the high frequency circuit substrate in accordance with the present invention.
Figure 9B:
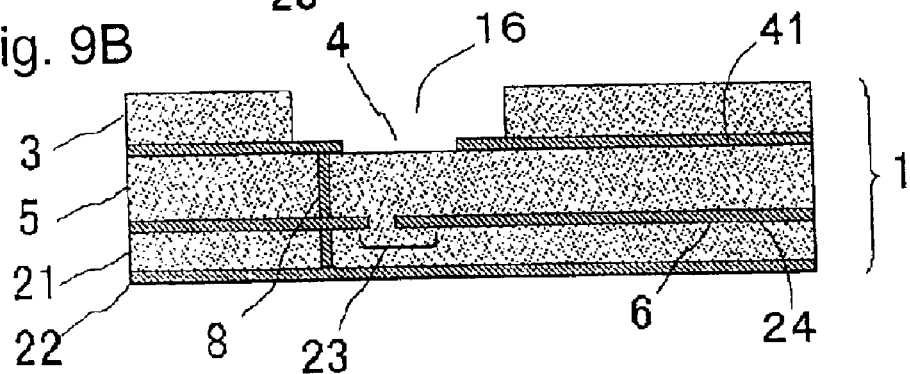

Now, a fifth embodiment of the high frequency circuit substrate in accordance with the present invention will be described with reference to the drawings. FIGS. 9A and 9B are a conductor pattern diagram and a sectional view of a first high frequency circuit substrate of the fifth embodiment of the high frequency circuit substrate in accordance with the present invention. In FIGS. 9A and 9B, elements similar to those shown in the preceding figures are given the same Reference Numbers, and explanation will be omitted for simplification of description.

This embodiment has a first high frequency circuit substrate 1 which includes a first dielectric material layer 3, a first conductor layer 41 having a slot 4 formed therein, a second dielectric material layer 5, and a (patterned) second conductor layer 24 forming a high frequency transmission line 6, a fifth dielectric material layer 21, and a ground conductor layer 22, which are laminated in the named order.

In this embodiment, the high frequency transmission line 6 is constituted of a coplanar line, which has a double slot 23 at its tip end. As shown, a plurality of via holes 8 are formed to interconnect between the ground conductor layer 22, the ground plane of the coplanar line 6 and the first conductor layer 41, and to prevent a signal leakage attributable to a spurious parallel plate mode.

In the first high frequency circuit substrate 1, the recess 16 is formed by partially removing in the first dielectric material layer 3, so that the slot 4 is exposed. In addition, similarly to the first to fourth embodiments, the required positioning precision can be relaxed, and the connection by the electromagnetic coupling can be surely obtained.

Sixth Embodiment

Figure 10A:
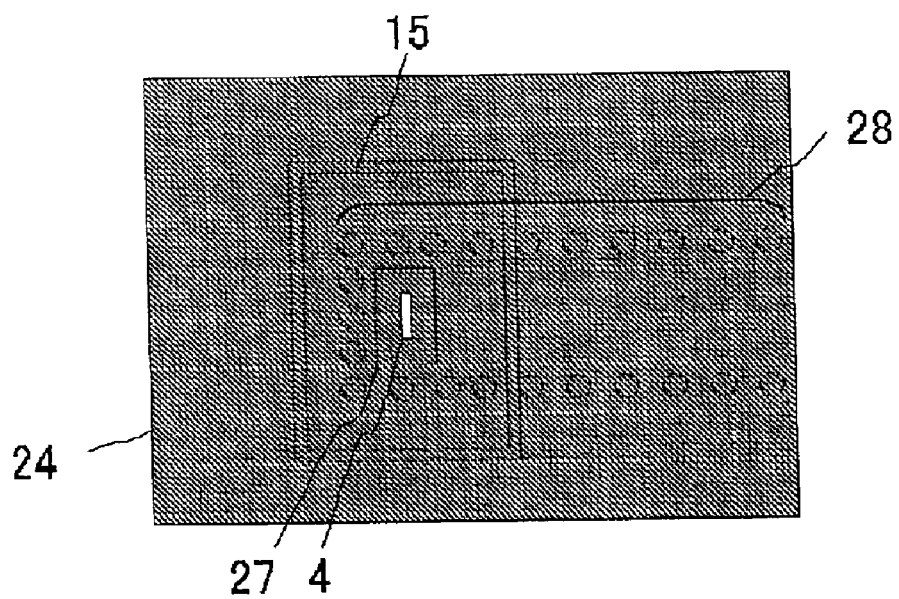
FIGS. 10A and 10B are a conductor pattern diagram and a sectional view of a first high frequency circuit substrate of a sixth embodiment of the high frequency circuit substrate in accordance with the present invention.
Figure 10B:
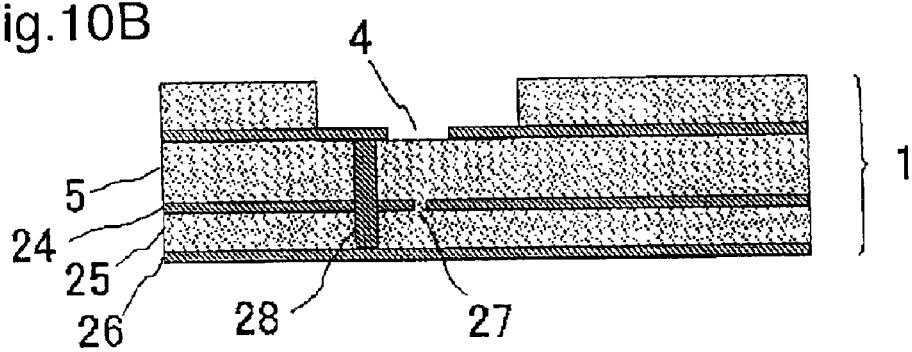

Now, a sixth embodiment of the high frequency circuit substrate in accordance with the present invention will be described with reference to the drawings. FIGS. 10A and 10B are a conductor pattern diagram and a sectional view of a first high frequency circuit substrate of the sixth embodiment of the high frequency circuit substrate in accordance with the present invention. In FIGS. 10A and 10B, elements similar to those shown in the preceding figures are given the same Reference Numbers, and explanation will be omitted for simplification of description.

This embodiment is featured in that a waveguiding structure formed on a seventh dielectric material layer 25 is used in place of the high frequency transmission line 6. The seventh dielectric material layer 25 is formed on the second conductor layer 24, and a fifth conductor layer 26 is formed on the seventh dielectric material layer 25. The waveguiding structure is constituted of the second conductor layer 24, the fifth conductor layer 26 and a plurality of via holes 28 interconnecting therebetween. A slot is formed in a tip end of the waveguiding structure.

Similarly to the first to fourth embodiments, the required positioning precision can be relaxed, and the connection by the electromagnetic coupling can be surely obtained.

Seventh Embodiment

Figure 11:
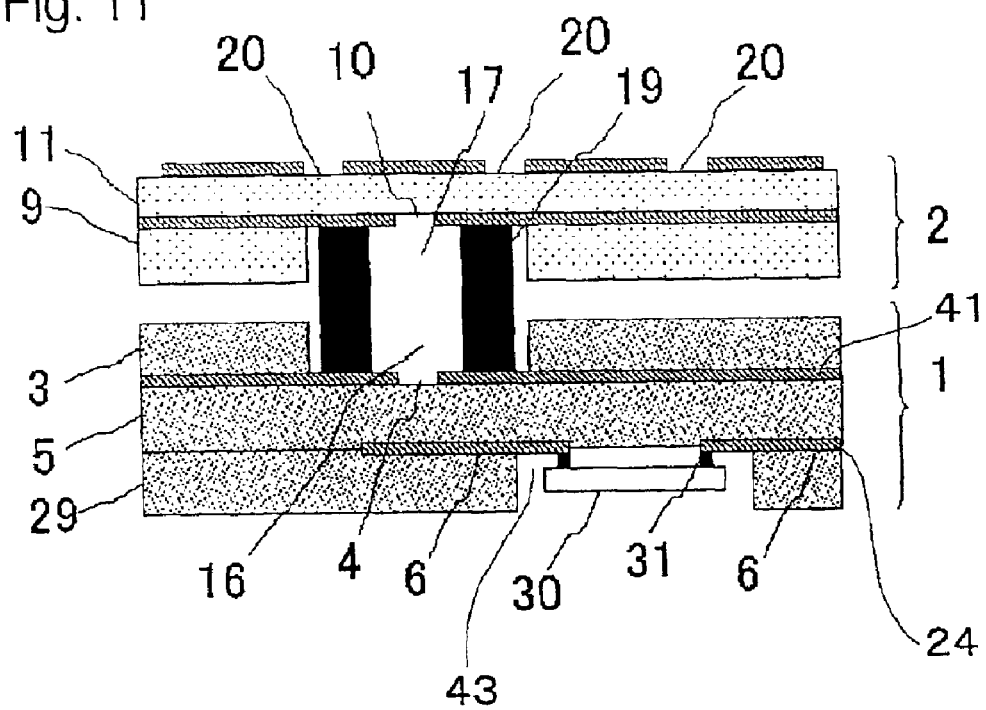
FIG. 11 is a diagrammatic sectional view of a main part of a seventh embodiment of the high frequency circuit substrate in accordance with the present invention.

Now, a seventh embodiment of the high frequency circuit substrate in accordance with the present invention will be described with reference to the drawings. FIG. 11 is a diagrammatic sectional view of a main part of the seventh embodiment of the high frequency circuit substrate in accordance with the present invention. In FIG. 11, elements similar to those shown in the preceding figures are given the same Reference Numbers, and explanation will be omitted for simplification of description.

As seen from comparison between FIG. 8 and FIG. 11, the seventh embodiment has a main part similar to that shown in FIG. 8, but is featured by an eighth dielectric layer 29 laminated on the structure shown in FIG. 8. This eighth dielectric layer 29 has a recess 43 formed therein, and a semiconductor device chip 30 is mounted in the recess 43 in a flip chip manner in that bumps 31 of the semiconductor device chip 30 are connected to the high frequency transmission line 6. Incidentally, the recesses 16, 17 and 43 can be realized by laminating the eighth dielectric layer 29 bored at a position corresponding to the recess 43, the first dielectric layer 3 bored at a position corresponding to the recess 16, the second dielectric layer 9 bored at a position corresponding to the recess 17, and the conductor layers (41, 24, etc.)

Similarly to the first to fourth embodiments, in this embodiment, the required positioning precision can be relaxed, and the connection by the electromagnetic coupling can be surely obtained.

Eighth Embodiment

Figure 12:
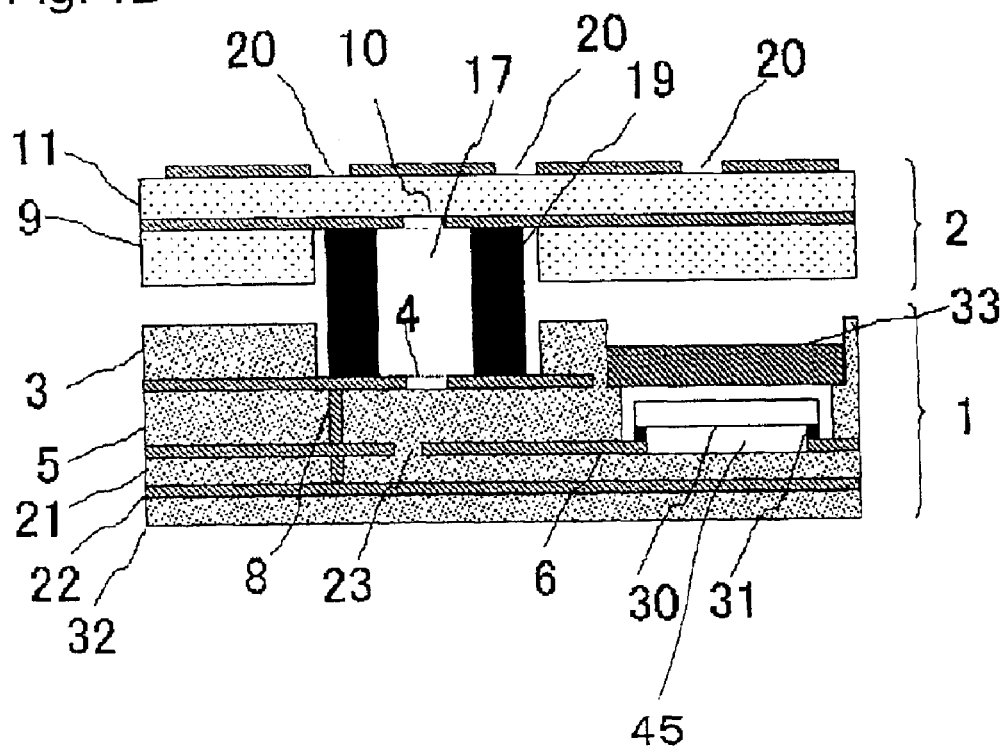
FIG. 12 is a diagrammatic sectional view of a main part of an eighth embodiment of the high frequency circuit substrate in accordance with the present invention.

Now, an eighth embodiment of the high frequency circuit substrate in accordance with the present invention will be described with reference to the drawings. FIG. 12 is a diagrammatic sectional view of a main part of the eighth embodiment of the high frequency circuit substrate in accordance with the present invention. In FIG. 12, elements similar to those shown in the preceding figures are given the same Reference Numbers, and explanation will be omitted for simplification of description.

In FIG. 12, the Reference Number 30 designates a semiconductor device chip, and the Reference Number 31 indicates bumps of the semiconductor device chip 30. The Reference Number 32 denotes a sixth dielectric material layer, and the Reference Number 33 shows a lid.

In this embodiment, a recess 45 is formed by partially removing the first dielectric material layer 3 and the second dielectric material layer 5 of the first high frequency circuit substrate 1 shown in FIG. 9, and the semiconductor device chip 30 is mounted in the recess 45 in a flip chip manner in that bumps 31 of the semiconductor device chip 30 are connected to the high frequency transmission line 6.

Similarly to the first to fourth embodiments, in this embodiment, the required positioning precision can be relaxed, and the connection by the electromagnetic coupling can be surely obtained.

In this embodiment, the material of the high frequency circuit substrates is not specified, but the high frequency circuit substrates can be formed of any material which can form a multilayer substrate. For example, the high frequency circuit substrates can be formed of ceramic or glass-epoxy. If the ceramic is used, it is possible to utilize a conventional process of laminating green sheets each having a conductor pattern and sintering the laminated green sheets. In addition, if a green sheet having an opening formed therethrough and a green sheet having no opening are laminated and sintered together, the recess mentioned in the above embodiments can be formed.

The first high frequency circuit substrates 1 and the second high frequency circuit substrates 2 mentioned in the above embodiments can be freely combined. For example, the structure shown in FIGS. 9A and 9B and the structure shown in FIGS. 10A and 10B can be connected by the conductor plate 19. In addition, the structure of the antenna and the structure of the feeder line are in no way limited to those described above.

The invention has thus been shown and described with reference to the specific embodiments. However, it should be noted that the present invention is in no way limited to the details of the illustrated structures but changes and modifications may be made within the scope of the appended claims. Particularly, the number, the position and the shape of the constituents as mentioned above are in no way limited to the details of the illustrated structures, but can be freely modified in executing the present invention.

As seen from the above, according to the present invention, it is possible to connect multilayer substrates in a high frequency range such as millimeter wave, by a relatively simple means and with a low connection loss. In addition, a positioning precision required for realizing a good electromagnetic coupling can be relaxed.

Furthermore, by providing the recess in the high frequency circuit substrate, it is possible to reduce the connection loss attributable to the dielectric loss. Moreover, by providing the recess in the high frequency circuit substrate, and by connecting the multilayer substrates through the conductor plate having the through hole, even if a large-scaled high frequency circuit substrate having a large-scaled circuit mounted thereon is used, parts to be connected can be closely contacted, and the respective grounds of both the circuit substrates can be surely electrically connected. In this case, a mounter capable of realizing a high degree of positioning or alignment is no longer necessary.

In addition, if the high frequency circuit substrate is an array antenna, it is possible to easily supply a power to a central part of the array antenna, so that a power supply loss can be reduced.

Thus, it is possible to realize a high frequency module which has a high performance and an excellent yield of production and which is suitable to a mass production with a low cost.

What is claimed is:

1. A high frequency circuit substrate comprising:
   a first high frequency circuit substrate including at least a first dielectric material layer, a first conductor layer, a second dielectric material layer and a second conductor layer, which are laminated in the named order, said first conductor layer having a first slot formed therein, and said second conductor layer forming a feeder line;
   a second high frequency circuit substrate including at least a third dielectric material layer, a third conductor layer, a fourth dielectric material layer and a fourth conductor layer, which are laminated in the named order, said third conductor layer having a second slot formed therein, and said fourth conductor layer forming a transmission line,
   said first high frequency circuit substrate and said second high frequency circuit substrate being stacked to each other in such a manner that said first dielectric material layer and said third dielectric material layer are positioned adjacent each other and said first slot and said second slot are directly electromagnetically coupled to each other.

2. A high frequency circuit substrate claimed in claim 1 wherein said first slot and said second slot are positioned to face to each other.

3. A high frequency circuit substrate comprising:
   a first high frequency circuit substrate including at least a first dielectric material layer, a first conductor layer, a second dielectric material layer and a second conductor layer, which are laminated in the named order, said first conductor layer having a first slot formed therein, and said second conductor layer forming a feeder line; and
   a second high frequency circuit substrate including at least a third dielectric material layer, a third conductor layer, a fourth dielectric material layer and a fourth conductor layer, which are laminated in the named order, said third conductor layer having a second slot formed therein, and said fourth conductor layer forming a transmission line,
   said first high frequency circuit substrate and said second high frequency circuit substrate being stacked to each other in such a manner that said first dielectric material layer and said third dielectric material layer are positioned adjacent each other and said first slot and said second slot are electromagnetically coupled, wherein said first slot and said second slot are positioned to face to each other, and
   said first high frequency circuit substrate has a first ground conductor plane formed on a surface of said first dielectric material layer opposite to said first conductor layer, said first ground conductor having an opening at a position corresponding to said first slot,
   wherein said second high frequency circuit substrate has a second ground conductor plane formed on a surface of said third dielectric material layer opposite to said third conductor layer, said second ground conductor having an opening at a position corresponding to said second slot,
   said first high frequency circuit substrate and said second high frequency circuit substrate being stacked in such a manner that said first ground conductor plane is in contact with said second ground conductor plane.

4. A high frequency circuit substrate claimed in claim 3 wherein said first ground conductor plane is electrically connected to said first conductor layer through via holes, and said second ground conductor plane is electrically connected to said third conductor layer through via holes.

5. A high frequency circuit substrate claimed in claim 1 wherein said first high frequency circuit substrate includes said first dielectric material layer, said first conductor layer, said second dielectric material layer, said second conductor layer, a fifth dielectric material layer and a ground conductor layer, which are laminated in the named order, said first conductor layer having said first slot formed therein, and said second conductor layer having a third slot formed therein and constituting said transmission line, said first slot and said third slot being positioned to be electromagnetically coupled, said first high frequency circuit substrate and said second high frequency circuit substrate being stacked to each other in such a manner that said first slot, said third slot and said second slot are electromagnetically coupled.

6. A high frequency circuit substrate claimed in claim 5 wherein said first slot and said third slot are positioned to face to each other, and said first slot and said second slot are positioned to face to each other.

7. A high frequency circuit substrate, comprising:
   a first high frequency circuit substrate including a first dielectric material layer, a first conductor layer, a second dielectric material layer, a second conductor layer, a fifth dielectric material layer and a fifth conductor layer, which are laminated in the named order, a waveguiding structure being formed of said second conductor layer, said fifth conductor layer and a group of via holes interconnecting between said second conductor layer and said fifth conductor layer, said first conductor layer having a first slot formed therein, and said second conductor layer having a third slot formed therein, said first slot and said third slot being positioned to be electromagnetically coupled,
   a second high frequency circuit substrate including at least a third dielectric material layer, a third conductor layer, a fourth dielectric material layer and a fourth conductor layer, which are laminated in the named order, said third conductor layer having a second slot formed therein, and said fourth conductor layer forming a transmission line,
   said first high frequency circuit substrate and said second high frequency circuit substrate being stacked to each other in such a manner that said first dielectric material layer and said third dielectric material layer are faced to each other and said first slot, said third slot and said second slot are electromagnetically coupled.

8. A high frequency circuit substrate claimed in claim 7 wherein said first slot and said third slot are positioned to face to each other, and said first slot and said second slot are positioned to face to each other.

9. A high frequency circuit substrate claimed in claim 1 wherein at least one of said first dielectric material layer and said third dielectric material layer has a recess formed therein.

10. A high frequency circuit substrate claimed in claim 1 wherein each of said first dielectric material layer and said third dielectric material layer has a recess formed therein having a bottom exposing said slot of an underlying conductor layer.

11. A high frequency circuit substrate claimed in claim 10 wherein a conductor plate having a through hole is located in the respective recesses of said first dielectric material layer and said third dielectric material layer.

12. A high frequency circuit substrate claimed in claim 11 wherein said through hole having at least two different opening sizes coupled by a stepped portion.

13. A high frequency circuit substrate claimed in claim 12 wherein a dielectric material plate is inserted on said stepped portion of said through hole.

14. A high frequency circuit substrate claimed in claim 11 wherein said first high frequency circuit substrate and said second high frequency circuit substrate are electromagnetically coupled to each other through said through hole of said conductor plate.

15. A high frequency circuit substrate claimed in claim 10 wherein one of said first high frequency circuit substrate and said second high frequency circuit substrate includes an antenna.

16. A high frequency circuit substrate claimed in claim 10 wherein one of said first high frequency circuit substrate and said second high frequency circuit substrate includes a semiconductor device chip connected to said transmission line.

17. A high frequency circuit substrate claimed in claim 5 wherein each of said first dielectric material layer and said third dielectric material layer has a recess formed therein having a bottom exposing said slot of an underlying conductor layer, and a conductor plate having a through hole is located in the respective recesses of said first dielectric material layer and said third dielectric material layer, so that said first high frequency circuit substrate and said second high frequency circuit substrate are electromagnetically coupled to each other through said through hole of said conductor plate.

18. A high frequency circuit substrate claimed in claim 17 wherein said through hole having at least two different opening sizes coupled by a stepped portion.

19. A high frequency circuit substrate claimed in claim 18 wherein a dielectric material plate is inserted on said stepped portion of said through hole.

20. A high frequency circuit substrate claimed in claim 7 wherein each of said first dielectric material layer and said third dielectric material layer has a recess formed therein having a bottom exposing said slot of an underlying conductor layer, and a conductor plate having a through hole is located in the respective recesses of said first dielectric material layer and said third dielectric material layer, so that said first high frequency circuit substrate and said second high frequency circuit substrate are electromagnetically coupled to each other through said through hole of said conductor plate.

21. A high frequency circuit substrate claimed in claim 20 wherein said through hole having at least two different opening sizes coupled by a stepped portion.

22. A high frequency circuit substrate claimed in claim 21 wherein a dielectric material plate is inserted on said stepped portion of said through hole.

23. A method for fabricating a high frequency circuit substrate, comprising the steps of:
   preparing a first high frequency circuit substrate including at least a first dielectric material layer, a first conductor layer, a second dielectric material layer and a second conductor layer, which are laminated in the named order, said first conductor layer having a first slot formed therein, and said second conductor layer forming a transmission line, said first dielectric material layer having a first opening exposing said first slot at its bottom;
   preparing a second high frequency circuit substrate including at least a third dielectric material layer, a third conductor layer, a fourth dielectric material layer and a fourth conductor layer, which are laminated in the named order, said third conductor layer having a second slot formed therein, and said fourth conductor layer forming a transmission line, said third dielectric material layer having a second opening exposing said second slot at its bottom; and
   bonding said first high frequency circuit substrate and said second high frequency circuit substrate to each other in such a manner that said first dielectric material layer and said third dielectric material layer are positioned adjacent each other and said first slot and said second slot are electromagnetically coupled, by inserting one side and the other side of a conductor plate having a through hole, into said first opening and said second opening, respectively so that said conductor plate is located within recesses formed in said first and second high frequency circuit substrates by said first opening and said second opening, respectively.

24. A high frequency circuit substrate claimed in claim 17, wherein one of said first high frequency circuit substrate and said second high frequency circuit substrate includes an antenna.

25. A high frequency circuit substrate claimed in claim 17, wherein one of said first high frequency circuit substrate and said second high frequency circuit substrate includes a semiconductor device chip connected to said transmission line.

26. A high frequency circuit substrate claimed in claim 20, wherein one of said first high frequency circuit substrate and said second high frequency circuit substrate includes an antenna.

27. A high frequency circuit substrate claimed in claim 20, wherein one of said first high frequency circuit substrate and said second high frequency circuit substrate includes a semiconductor device chip connected to said transmission line.

28. A high frequency circuit substrate claimed in claim 1, wherein one of said first high frequency circuit substrate and said second high frequency circuit substrate includes an antenna.

29. A high frequency circuit substrate claimed in claim 1, wherein one of said first high frequency circuit substrate and said second high frequency circuit substrate includes a semiconductor device chip connected to said transmission line.

30. A high frequency circuit substrate claimed in claim 5, wherein one of said first high frequency circuit substrate and said second high frequency circuit substrate includes an antenna.

31. A high frequency circuit substrate claimed in claim 5, wherein one of said first high frequency circuit substrate and said second high frequency circuit substrate includes a semiconductor device chip connected to said transmission line.

32. A high frequency circuit substrate claimed in claim 7, wherein one of said first high frequency circuit substrate and said second high frequency circuit substrate includes an antenna.

33. A high frequency circuit substrate claimed in claim 7, wherein one of said first high frequency circuit substrate and said second high frequency circuit substrate includes a semiconductor device chip connected to said transmission line.

34. A high frequency circuit substrate comprising at least a first high frequency circuit substrate which includes a first dielectric material layer, a first conductor layer, a second dielectric material layer, a second conductor layer, a third dielectric material layer and a first ground conductor layer, which are laminated in the named order, said first conductor layer having a first slot formed therein, and said second conductor layer having a second slot formed therein and constituting a transmission line, said first slot and said second slot being positioned to be electromagnetically coupled.

35. A high frequency circuit substrate claimed in claim 34, further including a second high frequency circuit substrate which includes a fourth dielectric material layer, a third conductor layer, a fifth dielectric material layer, a fourth conductor layer, a sixth dielectric material layer and a second ground conductor layer, which are laminated in the named order, said third conductor layer having a third slot formed therein, and said fourth conductor layer having a fourth slot formed therein and constituting a transmission line, said third slot and said fourth slot being positioned to be electromagnetically coupled, said first high frequency circuit substrate and said second high frequency circuit substrate being stacked to each other in such a manner that said first to fourth slots are electromagnetically coupled.

36. A high frequency circuit substrate claimed in claim 35, wherein each of said first dielectric material layer and said fourth dielectric material layer has a recess formed therein having a bottom exposing said slot of an underlying conductor layer, and a conductor plate having a through hole is located in the respective recesses of said first dielectric material layer and said fourth dielectric material layer, so that said first high frequency circuit substrate and said second high frequency circuit substrate are electromagnetically coupled to each other through said through hole of said conductor plate.

37. A high frequency circuit substrate claimed in claim 36, wherein said through hole having at least two different opening sizes coupled by a stepped portion.

38. A high frequency circuit substrate claimed in claim 37, wherein a dielectric material plate is inserted on said stepped portion of said through hole.

39. A high frequency circuit substrate claimed in claim 36, wherein one of said first high frequency circuit substrate and said second high frequency circuit substrate includes an antenna.

40. A high frequency circuit substrate claimed in claim 36, wherein one of said first high frequency circuit substrate and said second high frequency circuit substrate includes a semiconductor device chip connected to said transmission line.

41. A high frequency circuit substrate claimed in claim 34, wherein one of said first high frequency circuit substrate and said second high frequency circuit substrate includes an antenna.

42. A high frequency circuit substrate claimed in claim 34, wherein one of said first high frequency circuit substrate and said second high frequency circuit substrate includes a semiconductor device chip connected to said transmission line.

43. A high frequency circuit substrate comprising at least a first high frequency circuit substrate which includes a first dielectric material layer, a first conductor layer, a second dielectric material layer, a second conductor layer, a third dielectric material layer and a third conductor layer, which are laminated in the named order, a waveguiding structure being formed of said second conductor layer, said third conductor layer and a group of via holes interconnecting between said second conductor layer and said third conductor layer, said first conductor layer having a first slot formed therein, and said second conductor layer having a second slot formed therein, said first slot and said second slot being positioned to be electromagnetically coupled.

44. A high frequency circuit substrate claimed in claim 43, further including a second high frequency circuit substrate which includes a fourth dielectric material layer, a fourth conductor layer, a fifth dielectric material layer, a fifth conductor layer, a sixth dielectric material layer and a sixth conductor layer, which are laminated in the named order, a waveguiding structure being formed of said fifth conductor layer, said sixth conductor layer and a group of via holes interconnecting between said fifth conductor layer and said sixth conductor layer, said fourth conductor layer having a third slot formed therein, and said fifth conductor layer having a fourth slot formed therein, said third slot and said fourth slot being positioned to be electromagnetically coupled, said first high frequency circuit substrate and said first high frequency circuit substrate being stacked to each other in such a manner that said first to fourth slots are electromagnetically coupled.

45. A high frequency circuit substrate claimed in claim 44, wherein each of said first dielectric material layer and said fourth dielectric material layer has a recess formed therein having a bottom exposing said slot of an underlying conductor layer, and a conductor plate having a through hole is located in the respective recesses of said first dielectric material layer and said fourth dielectric material layer, so that said first high frequency circuit substrate and said second high frequency circuit substrate are electromagnetically coupled to each other through said through hole of said conductor plate.

46. A high frequency circuit substrate claimed in claim 45, wherein said through hole having at least two different opening sizes coupled by a stepped portion.

47. A high frequency circuit substrate claimed in claim 46, wherein a dielectric material plate is inserted on said stepped portion of said through hole.

48. A high frequency circuit substrate claimed in claim 45, wherein one of said first high frequency circuit substrate and said second high frequency circuit substrate includes an antenna.

49. A high frequency circuit substrate claimed in claim 45, wherein one of said first high frequency circuit substrate and said second high frequency circuit substrate includes a semiconductor device chip connected to said transmission line.

50. A high frequency circuit substrate claimed in claim 43, wherein one of said first high frequency circuit substrate and said second high frequency circuit substrate includes an antenna.

51. A high frequency circuit substrate claimed in claim 43, wherein one of said first high frequency circuit substrate and said second high frequency circuit substrate includes a semiconductor device chip connected to said transmission line.

* * * * *